United States Patent
Lee et al.

(10) Patent No.: US 7,615,923 B2
(45) Date of Patent: Nov. 10, 2009

(54) DUAL-PLATE ORGANIC ELECTRO-LUMINESCENT DEVICE AND METHOD FOR MANUFACTURING THE SAME

(75) Inventors: Jae Yoon Lee, Seoul (KR); Joon Suk Lee, Seoul (KR); Young Mi Kim, Incheon-si (KR)

(73) Assignee: LG Display Co., Ltd., Seoul (KR)

( * ) Notice: Subject to any disclaimer, the term of this patent is extended or adjusted under 35 U.S.C. 154(b) by 400 days.

(21) Appl. No.: 11/645,688

(22) Filed: Dec. 27, 2006

(65) Prior Publication Data

US 2007/0152575 A1   Jul. 5, 2007

(30) Foreign Application Priority Data

Dec. 30, 2005   (KR) ............... 10-2005-0135538

(51) Int. Cl.
*H05B 33/00* (2006.01)
(52) U.S. Cl. ............................ 313/506; 313/504
(58) Field of Classification Search ................ None
See application file for complete search history.

(56) References Cited

U.S. PATENT DOCUMENTS

| 7,402,946 | B2 * | 7/2008 | Park et al. ............... 313/504 |
| 2005/0001546 | A1 * | 1/2005 | Yamaguchi ............... 313/512 |
| 2005/0007015 | A1 * | 1/2005 | Yokoyama et al. ........ 313/506 |
| 2006/0055999 | A1 * | 3/2006 | Bae et al. ................. 359/245 |
| 2007/0120480 | A1 * | 5/2007 | Kwon ....................... 313/512 |

* cited by examiner

*Primary Examiner*—Ashok Patel
(74) *Attorney, Agent, or Firm*—Holland & Knight LLP

(57) ABSTRACT

A dual plate organic electro-luminescent device includes a first substrate and a second substrate having pixel regions, wherein the first substrate and the second substrate facing each other, a thin film transistor on the first substrate in each of the pixel regions, a first electrode on the second substrate, a bus line on the first electrode in regions other than the pixel regions such that the bus line has a round shape at each corner portion of each pixel region, barrier ribs on outside portions of the bus line so as to surround each of the pixel regions, an organic electro-luminescent layer on the first electrode in each of the pixel regions, a second electrode formed on the barrier rib and the organic electro-luminescent layer in each of the pixel regions, and a connection pattern connecting the thin film transistor and the second electrode.

11 Claims, 12 Drawing Sheets

DUAL-PLATE ORGANIC ELECTRO-LUMINESCENT DEVICE AND METHOD FOR MANUFACTURING THE SAME

This application claims the benefit of Korean Patent Application No. P2005-0135538 filed on Dec. 30, 2005, which is hereby incorporated by reference in its entirety.

BACKGROUND OF THE INVENTION

1. Field of the Invention

Embodiments of the invention relates to an organic electro-luminescent device, and more particularly, to a dual-plate organic electro-luminescent device and a method for manufacturing the same.

2. Discussion of the Related Art

Since organic electro-luminescent devices (hereinafter referred to as "organic EL devices") in the field of flat display devices are self-luminous display devices, they have a wide viewing angle and a large contrast ratio, as compared to liquid crystal display (LCD) devices. In addition, because the organic EL devices do not require any backlight assembly, they can be light weight and have a thin profile. Further, the organic EL devices have less power consumption than LCD devices.

The organic EL devices can be driven at a low DC drive voltage and have a high response speed. Since all components of the organic EL devices are formed of solid materials, EL devices are resistant to external impact. The organic EL devices can also be used throughout a wide temperature range but yet still can be inexpensively manufactured. For example, the organic EL devices can be manufactured using deposition and encapsulation equipment. As a result, the manufacture method of the organic EL devices is very simple.

When an organic EL device is driven in an active matrix type which uses a thin film transistor arranged at each of pixel regions as a switching device for each pixel, uniform brightness can be obtained even when a low current is applied. Accordingly, the organic EL device has advantages of low power consumption, high definition and large-sized screen. Organic EL devices display a video image by exciting fluorescent materials using carriers, such as electrons and holes.

On the other hand, a passive matrix type, which has no thin film transistor for pixel switching, can also be employed to drive organic EL devices. However, the passive matrix type organic EL devices have technical limitations, such as increased power consumption and decreased lifetime. Accordingly, a variety of studies associated with active matrix type organic EL devices have been made to manufacture next-generation display devices, which meet the requirements for a high-definition large screen display.

The organic EL devices are classified into a bottom light-emitting type and a top light-emitting type, based on whether a light-emitting layer is arranged on a bottom substrate or a top substrate. In the case that the top light-emitting organic EL device is realized in an active matrix type, each thin film transistor is arranged on the bottom substrate, and the light-emitting layer is arranged on the top substrate. The organic EL device having this structure is often referred as to a "dual-plate organic electroluminescent device (DOD)".

FIG. 1 is a cross-sectional view illustrating a structure of the related art dual-plate organic electroluminescent device. As shown in FIG. 1, a DOD includes a first substrate 10 and a second substrate 20 formed to be spaced apart from each other. The related art DOD also includes a thin film transistor array having thin film transistors (TFTs) respectively formed on the first substrate 10 in regions corresponding to sub-pixels. The related art DOD also includes an organic electroluminescent diode formed on the second substrate 20, and seal patterns 30 formed on edges of the first substrate 10 and second substrate 20. To supply a current to each organic electroluminescent diode, a conductive spacer 17 and a transparent electrode 16 are formed to connect a second electrode 25 to the TFT of an associated sub-pixel.

In each sub-pixel, the organic electroluminescent diode includes a first electrode 21 used as a common electrode and a barrier rib 26 on the first electrode 21 at the boundary between adjacent sub-pixels. The organic electroluminescent diode also includes organic electroluminescent layers 22, 23 and 24 sequentially arranged together with the second electrode 25 in a region defined by an associated barrier rib 26, namely, the associated sub-pixel, while being formed in the form of patterns separated from those of other sub-pixels.

The organic electroluminescent layers include a first carrier transporting layer 22, a light-emitting layer 23 and a second carrier transporting layer 24 laminated in sequence. The first and second carrier transporting layers 22 and 24 serve to inject and transport electrons or holes to the light-emitting layer 23. The structures of the first and second carrier transporting layers 22 and 24 are determined depending on the arrangement of an anode and a cathode. For example, the light-emitting layer 23 may be made of a high-molecular weight material, and the first carrier transporting layer 22 and the second carrier transporting layer 24 may be defined as the anode and the cathode, respectively. In this case, the first carrier transporting layer 22 contacting the first electrode 21 has a structure in which a hole injection layer and a hole transporting layer are sequentially laminated on the first electrode 21. Also, the second carrier transporting layer 24 contacting the second electrode 25 has a structure in which an electron injection layer and an electron transporting layer are sequentially laminated on the second electrode 25.

The first and the second carrier transporting layer 22 and 24, and the light-emitting layer 23 may be made of a low-molecular weight material or a high-molecular weight material. When the low-molecular weight materials are used, these layers 22, 23 and 24 are formed by a vapor deposition method. When the high-molecular weight materials are used, these layers 22, 23 and 24 are formed by an inkjet method.

A major function of the conductive spacer 17 is not to maintain a cell gap. Instead, the function of the conductive spacer 17 is to electrically connect the two substrates, in contrast to the typical spacers for liquid crystal display (LCD) devices. Thus, the conductive spacer 17 has a certain three-dimensional shape in a space defined between the two substrates.

Each TFT connected to the associated organic electroluminescent diode is a driving thin film transistor. The TFT includes a gate electrode 11 formed at a predetermined portion on the first substrate 10, a semiconductor layer 13 formed in an island shape to cover the gate electrode 11, and a source electrode 14a and a drain electrode 14b formed at opposite sides of the semiconductor layer 13. A gate insulating film 12 is formed over the entire upper surface of the first substrate 10 between the gate electrode 11 and the semiconductor layer 13 in each sub-pixel. A passivation film 15 is formed on the gate insulating film 12, including the source electrode 14a and the drain electrode 14b. The drain electrode 14b is electrically connected to the transparent electrode 16 formed on the passivation film 15 through a hole disposed in the passivation film 15. The conductive spacer 17 is in contact with the top of the transparent electrode 16.

The conductive spacer 17 serves to electrically connect the drain electrode 14b of the TFT arranged at the associated sub-pixel on the first substrate 10 to the second electrode 25 arranged on the second substrate 20. The conductive spacer 17 is a metal-coated column spacer formed of an organic insulating material and the like. When the portions of the first substrate 10 corresponding to the sub-pixels are joined to corresponding portions of the second substrate 20, the conductive spacer 17 allows an electric current to flow between the drain electrode 14b and the second electrode 25 in the associated sub-pixel.

The outer portion of the conductive spacer 17 is made of a conductive metal material. In this case, a metal having high ductility is used. Further, the metal should have low resistivity.

The first electrode 21 is made of a transparent material. The second electrode 25 is formed of a light-shielding metal layer. The space between the first electrode 21 and the second electrode 25 is filled with an inert gas or insulating liquid.

Although not shown in FIG. 1, storage capacitors, scanning lines, signal lines and power supply lines crossing the scanning lines are formed on the first substrate 10.

The DOD includes a bus line having a lattice structure formed on the first electrode 21 made of a transparent material having a high specific resistivity. The bus line contributes to the prevention of a voltage drop in the first electrode 21. This will be explained in reference to FIGS. 2 and 3 below.

FIG. 2 is a plan view illustrating a bus line of the related art dual-plate organic electroluminescent device. FIG. 3 is a plan view illustrating a bus line and a barrier rib in one unit pixel of FIG. 2. With reference to FIGS. 2 and 3, the related art DOD also includes a bus line 50 formed in the form of a lattice in regions other than pixel regions on the first electrode 21, as shown in FIG. 2. The first electrode 21 is made of a transparent material to prevent a reduction in aperture ratio. However, when a voltage is applied to the first electrode 21, a drop in the voltage applied may occur in a center part of a display region due to a high specific resistivity of the transparent electrode material. To prevent such a voltage drop, the bus line 50, which has a low specific resistivity, is further provided in the related art DOD.

A barrier rib 55 is formed just on outside portion of the bus line 50 (i.e., a region other than pixel regions) and also overhangs the bus line 50 with an undercut structure so as to define a region where an organic electro-luminescent layer is to be formed. During formation of the second electrode on the electro-luminescent layer, such an undercut structure allows the barrier rib 55 to prevent a short circuit between the second electrode and the bus line. In other words, the undercut structure of the barrier rib 55 maintains an insulative separation between the second electrode and the bus line.

FIG. 4 is an SEM view illustrating a state in which the undercut of the barrier rib collapses in regions indicated by the circled reference numerals in FIG. 3. FIG. 5 is an SEM view illustrating a normal state of the undercut of the barrier rib in other regions other than regions indicated by the circled reference numerals in FIG. 3. Corner portions of the undercut of the barrier rib, as indicated by the circled reference numerals, partially overlap the bus line, as shown in FIG. 4. In these regions, the barrier rib has under portions which are not on the bus line but have protrusions overlapping the bus line. As a result, the protrusions of the undercut, which have a small thickness, may collapse toward the bus line.

On the other hand, in the remaining portions of the undercuts, since the barrier rib is formed on the outside portion of the bus line, it is located in regions where the bus line has no step, as shown in FIG. 5. In this region, accordingly, no protrusion of the barrier rib undercut comes in contact with the bus line therebeneath. As shown in FIG. 4, when the protrusions of the barrier rib collapses toward the bus line, the second electrode is not only formed on the organic light-emitting layer, including the barrier rib, but also on a portion of the bus line being in contact with the collapsed undercut. As a result, the first electrode and the second electrode may be short-circuited. Accordingly, normal operation cannot be achieved in regions where an undercut collapse has occurred.

When the barrier rib has an undercut structure, corner portions of the undercut of the barrier rib, such as the regions indicated by the circled reference numerals, are formed over the bus line. As a result, the protrusions of the undercut, which have a small thickness, may collapse down toward the bus line. In this case, the second electrode is not formed on the organic light-emitting layer including the barrier rib, but formed on a portion of the bus line being in contact with the collapsed undercut. As a result, the first electrode and the second electrode may be short-circuited. Accordingly, normal operation cannot be achieved in regions where an undercut collapse has occurred onto the bus line. In particular, regions where there is an undercut structure crosses a step of the bus line, the protrusion can be three times larger than a protrusion of the undercut located in other regions where there is no step crossing the bus line. The larger protrusions of the undercut become thinner so that undercut collapse may occur.

SUMMARY OF THE INVENTION

Accordingly, embodiments of the invention are directed to a dual-plate organic electro-luminescent device and a method for manufacturing the same that substantially obviate one or more problems due to limitations and disadvantages of the related art.

An object of embodiments of the invention is to provide a dual-plate organic electro-luminescent device and a method for manufacturing the same to prevent undercut collapse toward a bus line.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a dual-plate organic electro-luminescent device includes a first substrate and a second substrate having pixel regions, wherein the first substrate and the second substrate facing each other, a thin film transistor on the first substrate in each of the pixel regions, a first electrode on the second substrate, a bus line on the first electrode in regions other than the pixel regions such that the bus line has a round shape at each corner portion of each pixel region, barrier ribs on outside portions of the bus line so as to surround each of the pixel regions, an organic electro-luminescent layer on the first electrode in each of the pixel regions, a second electrode formed on the barrier rib and the organic electro-luminescent layer in each of the pixel regions, and a connection pattern connecting the thin film transistor and the second electrode.

In another aspect, a method manufacturing for a dual plate organic electro-luminescent device includes defining pixel regions on a first substrate, forming a thin film transistor on the first substrate in each of the pixel regions, depositing a first electrode over an entire surface of a second substrate, forming a bus line on the first substrate in a region other than the pixel regions such that the bus line has a round shape at each corner portion of each pixel region, forming barrier ribs on outside portions of the bus line so as to surround each of the pixel regions, forming an organic electro-luminescent layer on the first electrode in each of the pixel regions, forming a second electrode on the barrier rib and the organic electro-luminescent layer in each of the pixel regions, and forming a seal pattern on outer portions of the first substrate and the second substrate, and interposing a conductive spacer between the thin film transistor and the second electrode to bond the first substrate and the second substrate such that the second electrode is electrically connected to the thin film transistor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention associated with a dual-plate organic electro-luminescent device (DOD) and a method for manufacturing the dual-plate organic electro-luminescent device, examples of which are illustrated in the annexed drawings. Wherever possible, the same reference numbers will be used throughout the drawings to refer to the same or like parts.

Figure 1:
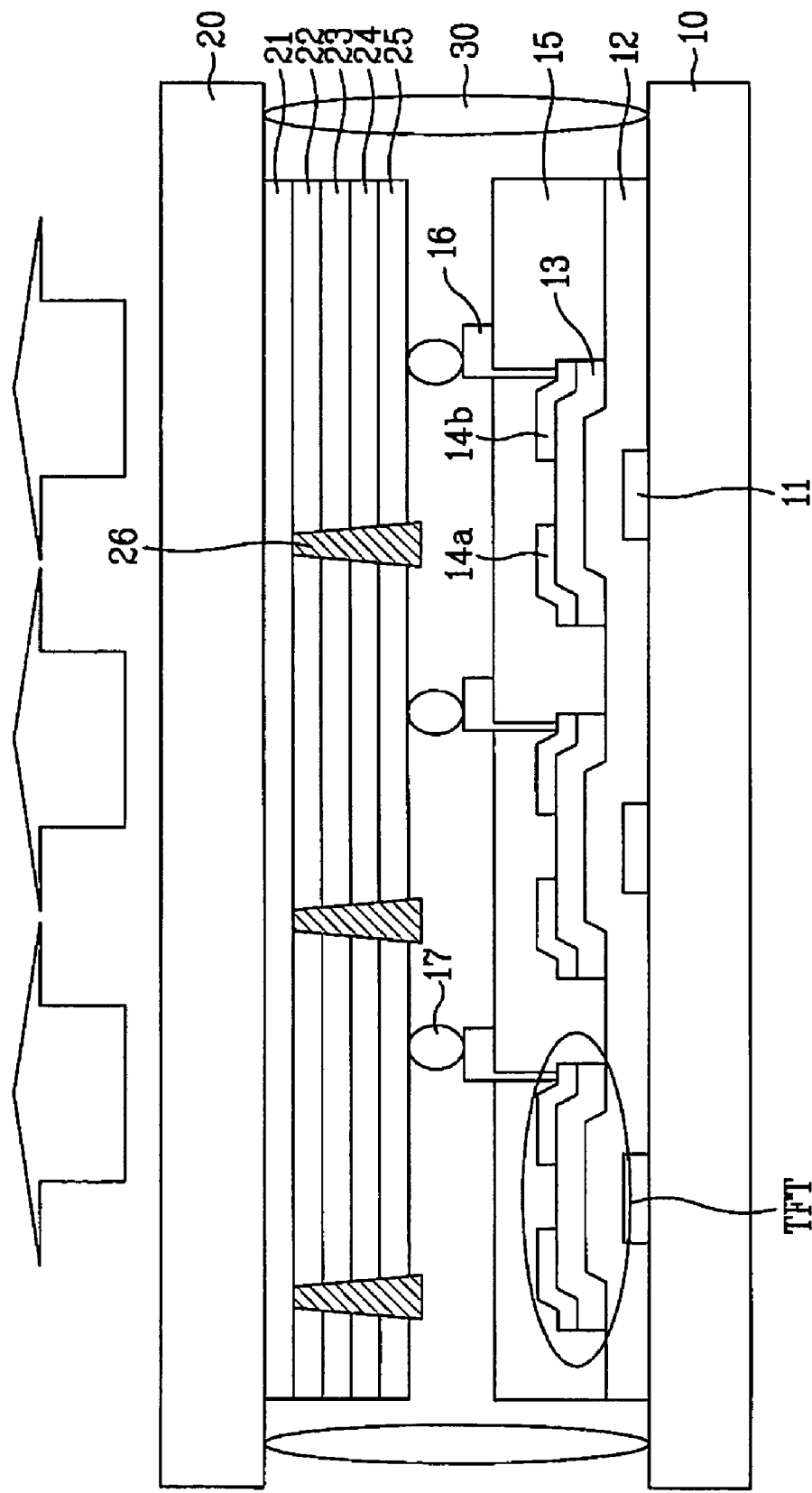
FIG. 1 is a cross-sectional view illustrating a structure of the related art dual-plate organic electroluminescent device.
Figure 2:
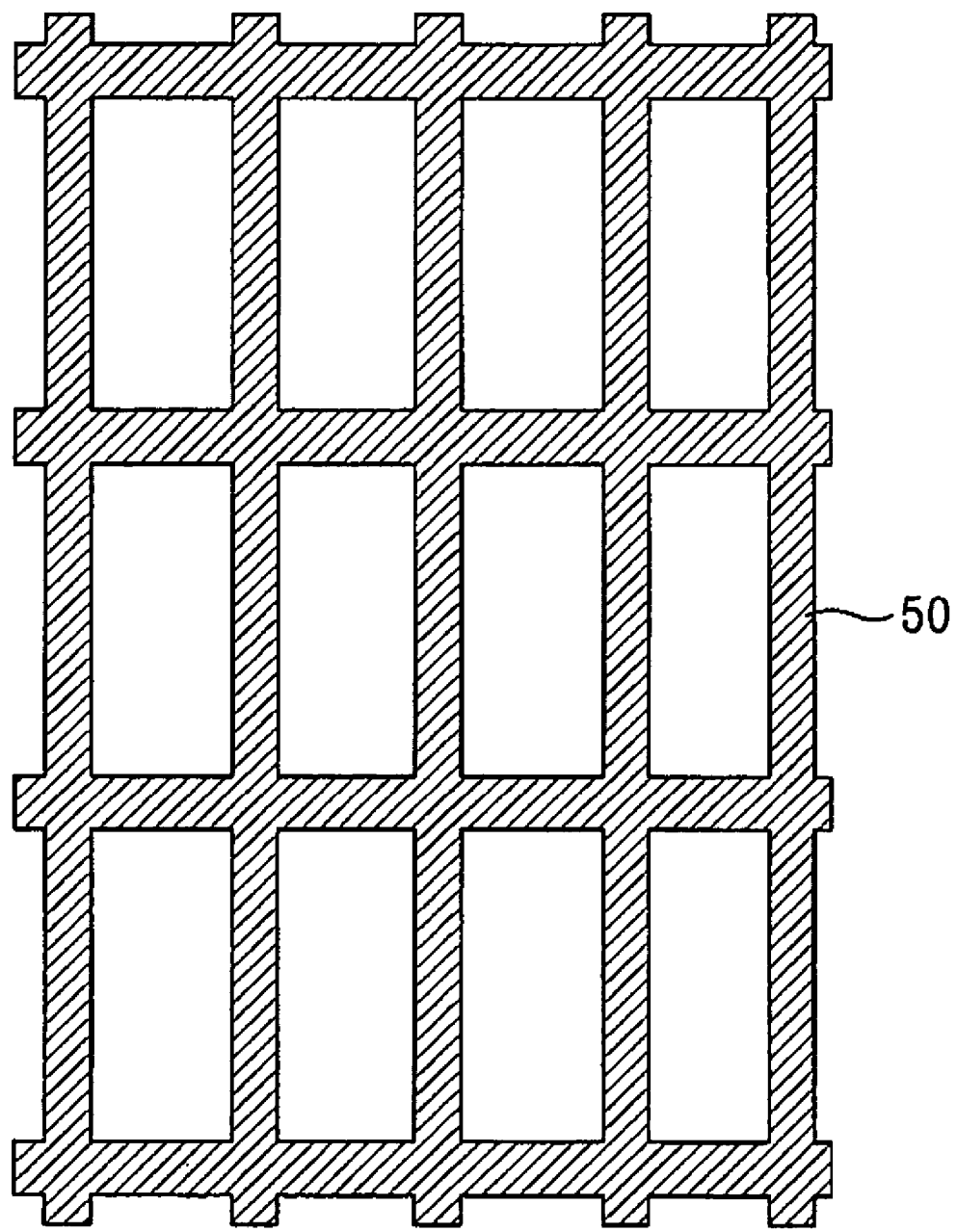
FIG. 2 is a plan view illustrating a bus line of the related art dual-plate organic electroluminescent device.
Figure 3:
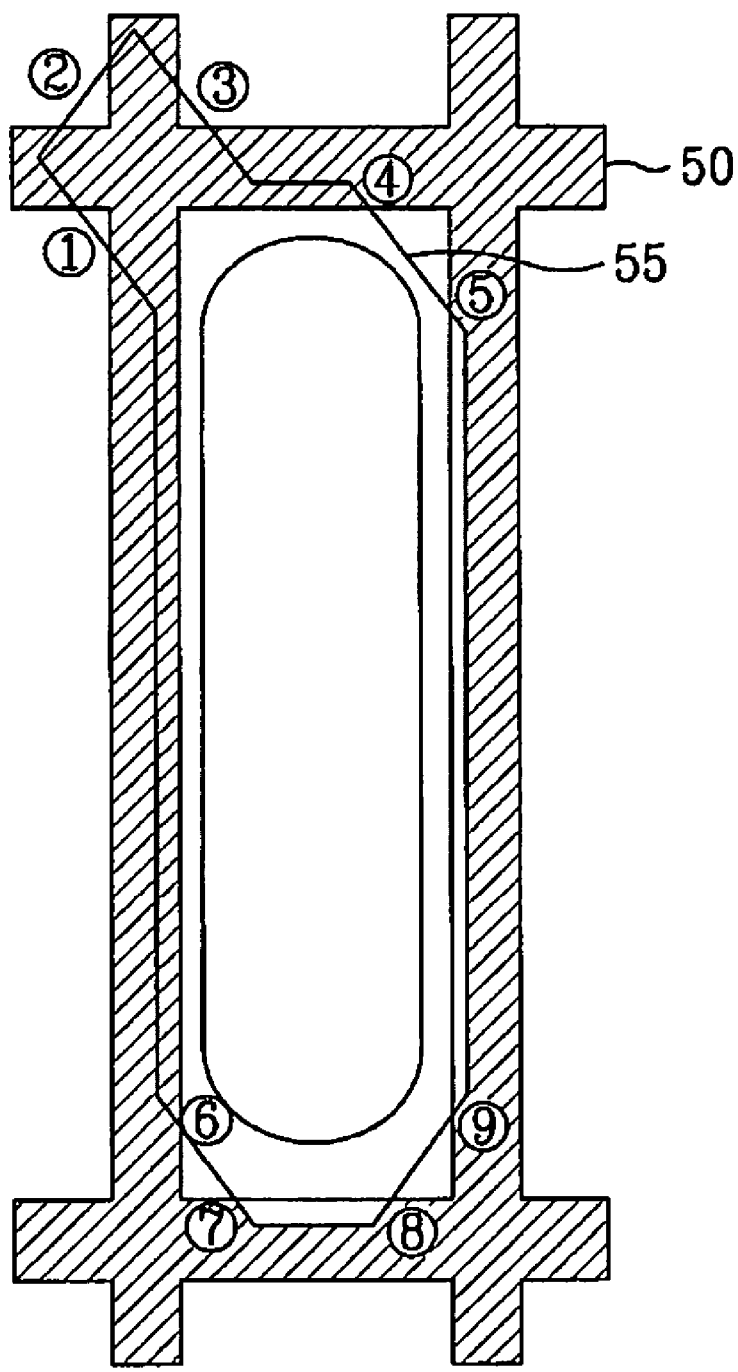
FIG. 3 is a plan view illustrating a bus line and a barrier rib in one unit pixel of FIG. 2.
Figure 4:
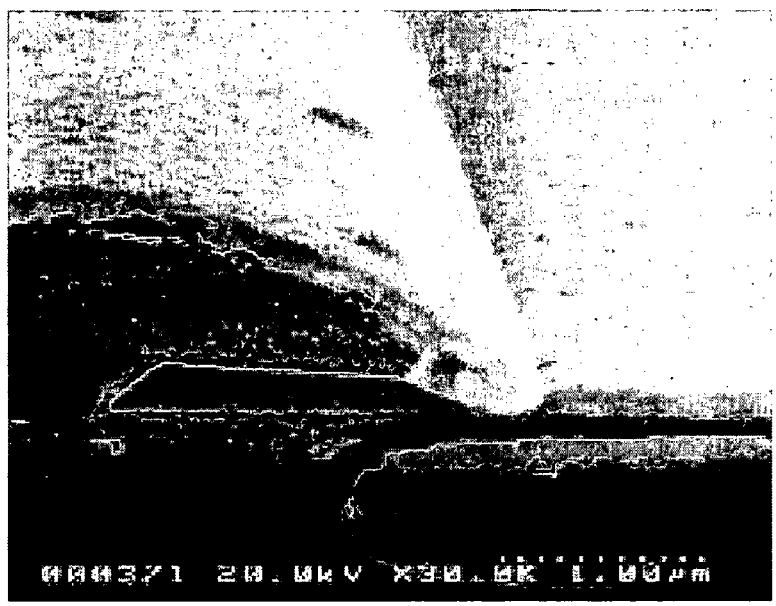
FIG. 4 is an SEM view illustrating a state in which an undercut of the barrier rib collapses in regions indicated by the circled reference numerals in FIG. 3.
Figure 5:
FIG. 5 is an SEM view illustrating a normal state of the undercut of the barrier rib in other regions other than regions indicated by the circled reference numerals in FIG. 3.
Figure 6:
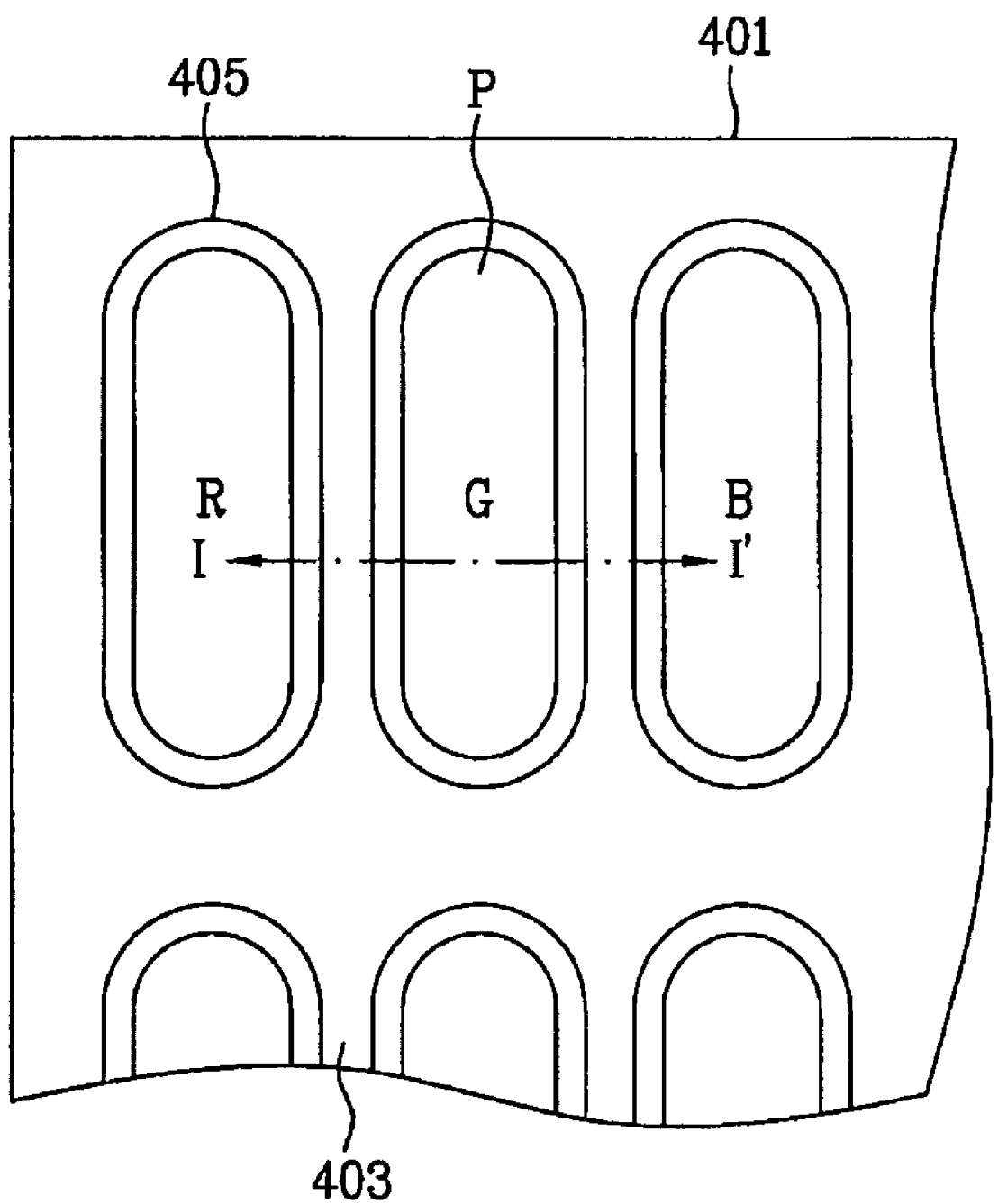
FIG. 6 is a plan view illustrating an upper substrate of the dual-plate organic electroluminescent device according to an embodiment of the invention.
Figure 7:
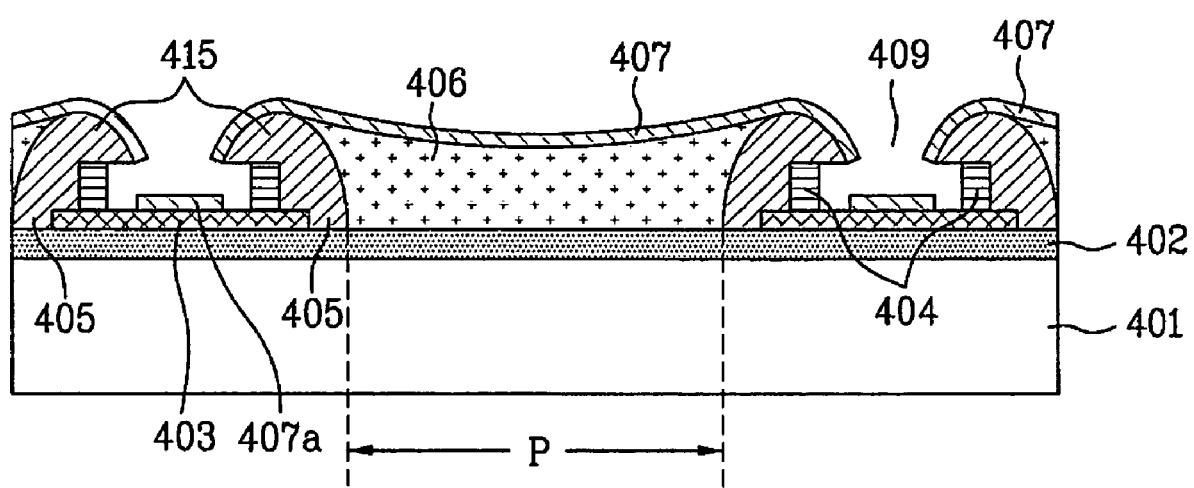
FIG. 7 is a cross-sectional view taken along the I-I' of FIG. 6.

FIG. 6 is a plan view illustrating an upper substrate of the dual-plate organic electroluminescent device according to an embodiment of the invention. FIG. 7 is a cross-sectional view taken along line I-I' of FIG. 6. As shown in FIGS. 6 and 7, the upper substrate (or a second substrate) 401 of the dual-plate organic electroluminescent device is defined by a plurality of pixel regions p arranged in the form of a matrix shape. A first electrode layer 402 is formed over the entire upper surface of the upper substrate 401, including the pixel regions p. The first electrode layer 402 is a hole injection electrode for injecting holes into organic luminescent layers 406 of the respective pixel regions.

A plurality of barrier ribs 405 are formed on the first electrode layer 402. The respective barrier ribs 405 are the first electrode layer 402 such that they surround each of the pixel regions and separate the adjacent pixel regions p. Since the barrier ribs 405 are spaced apart from one another, a certain space 409 exists between the adjacent barrier ribs 405. Each pixel region p is formed in the form of an elongated rectangle whose corners are rounded. A bus line 403 is formed in a region other than the pixel regions p. The bus line 403 has a honeycomb-like shape with corners rounded toward pixel regions p, in contrast to the related art lattice structure.

The barrier ribs 405 are formed on the bus line 403 with an overhang further overlapping the bus line 403. More specifically, each barrier rib 405 has an undercut (defined as a structure in which inside lower portion thereof is partially removed) having protrusions 415 inside the outer portion above the bus line 403. The protrusions 415, which are integrally formed with the barrier rib 405, protrude toward the space 409 between the adjacent barrier ribs 405. Accordingly, the protrusions 415 of the barrier rib 405 form a cross-section of "T" shape. Since the protrusion 415 of the adjacent barrier ribs 405 protrude toward the associated space 409 such that they face each other, the space 409 is partially shielded by the protrusion 415.

The first electrode 402 is a transparent electrode. The first electrode 402 is made of indium tin oxide (ITO), indium zinc oxide (IZO) or indium tin zinc oxide (ITZO). The bus line 403 is made of a light-shielding metal having a higher conductivity, in particular, higher than that of the first electrode 402. The light-shielding metal may include at least one of titanium (Ti), molybdenum (Mo), calcium (Ca), Kalium (K), magnesium (Mg), barium (Ba), copper (Cu) and aluminium (Al).

A dummy layer 404 is formed in the associated space 409 between the edges of the bus line 403 and each protrusion 415 in each space 409. The distance between the dummy layers 404 facing each other in each space 409 is larger the distance between the protrusions 415 facing each other. That is to say, the area of the bus line 403 shielded by the protrusions 415 is larger than the area of the bus line 403 shielded by the dummy layers 404. In other words, the protrusions 415 protrude further toward a central portion of the bus line 403, as compared to the coverage of dummy layers 404 over the bus line 403. As a result, the protrusions 415 are formed over the steps of the dummy layers 404. The dummy layers 404 enable the formation of the barrier ribs 405 with a more uniform and stable undercut structure. The dummy layers 404 may be entirely removed during a later etching process. Alternatively, the dummy layers 404 may remain in regions where no etchant reaches, as shown in FIGS. 6 and 7.

The organic luminescent layers 406 are formed on the first electrode 402 in the respective pixel regions p. Second electrodes 407 are respectively formed on the organic luminescent layers 406. The second electrodes 407 serve to inject electrons into the respective organic luminescent layers 406 as an electron injection electrode. A first carrier transporting layer and a second carrier transporting layer (not shown) are arranged in an upper portion and a lower portion of the organic luminescent layer 406, respectively. The first and second carrier transporting layers function to inject and transport the electrons and holes from the first electrode 402 and the second electrodes 407 to the organic luminescent layers 406.

The second electrodes 407 in the adjacent pixel regions are disconnected between each dummy layer 404 thereof and each protrusion 415 thereof due to the step formed between the dummy layer 404 and the protrusion 415. Thus, the second electrodes 407 are formed in respective pixel regions such that they are separated from one another. A layer 407a is separated from the associated second electrode 407 by the step of the barrier rib 405 as shown in FIG. 7.

Although not shown, the DOD according to the invention further includes a first substrate (a lower substrate) facing the second substrate 401 (the upper substrate). A plurality of pixel regions are defined on the lower substrate facing the upper substrate 401. The lower substrate includes a TFT (a switching device or a driving device) in each pixel region. The upper substrate 401 and the lower substrate are joined together by a sealant. A drain electrode of the driving element arranged on the lower substrate is in contact with the associated second electrode layer 407 on the upper substrate 401.

In each pixel region, the TFT includes a gate electrode formed on a predetermined portion of the lower substrate, a gate insulating film formed to cover the gate electrode, a semiconductor layer on the gate insulating film, and a source electrode and a drain electrode respectively formed at opposite sides of the semiconductor layer. The drain electrode is connected to the associated second electrode 407 through a connection pattern such that the drain electrode applies a signal driven by the TFT to the second electrode 407. Another connection pattern includes a pixel electrode (a transparent electrode) electrically connected to the TFT. A conductive spacer connects to the pixel electrode and supports the associated second electrode 407.

Figure 8:
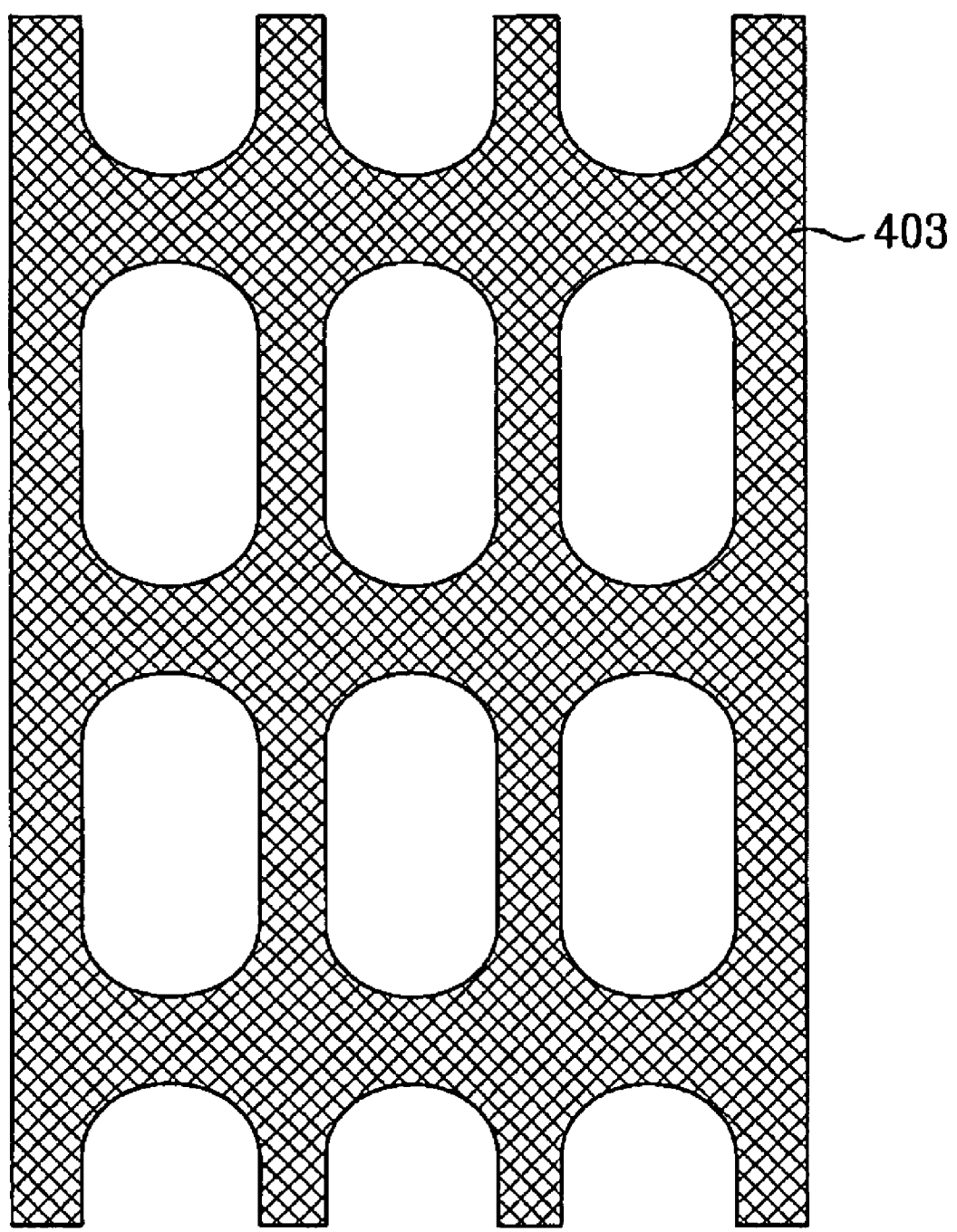
FIG. 8 is a plan view illustrating a bus line of the dual-plate organic electroluminescent device according to an embodiment of the invention.
Figure 9:
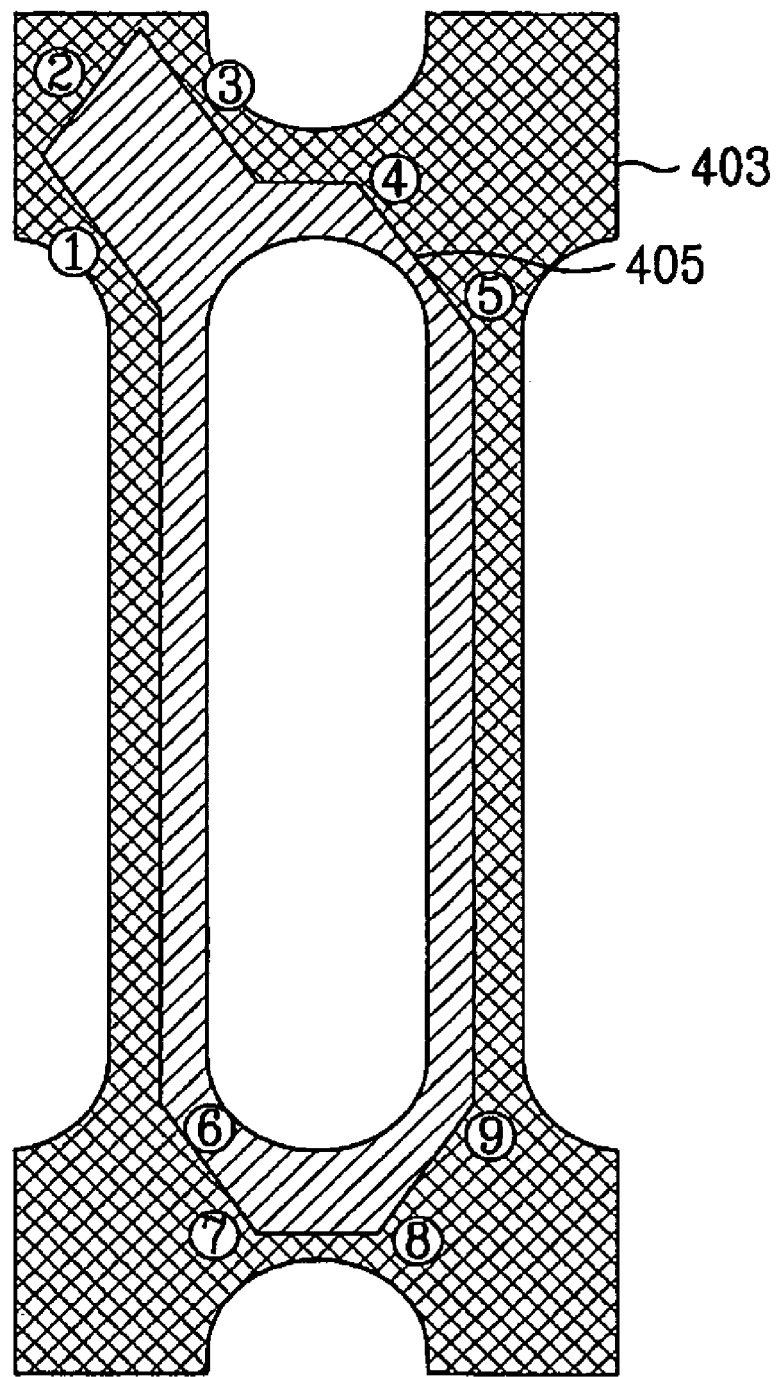
FIG. 9 is a plan view illustrating the bus line and barrier rib in one unit pixel.

FIG. 8 is a plan view illustrating the bus line of the dual-plate organic electroluminescent device according to an embodiment of the invention. FIG. 9 is a plan view illustrating the bus line and the barrier rib in one unit pixel. As shown in FIG. 9, the bus line 403 of the DOD has a honeycomb-like shape in regions other than the pixel regions. More specifically, the bus line 403 is formed on the first electrode 402 in the form of an elongated rectangles having rounded corners.

The barrier rib 405 is formed on the bus line 403 such that it has a side wall on the outside edge of the bus line 403 and protrusions over the inside of the bus line 403. The barrier rib 405 is formed on the leveled bus line 403 where no step exists. As a result, it is possible to prevent an undercut collapse of the barrier rib 405 by steps of the bus line 403.

FIGS. 10A to 10F are cross-sectional views illustrating a method for manufacturing the dual-plate organic electroluminescent device according to an embodiment of the invention.

Figure 10A:
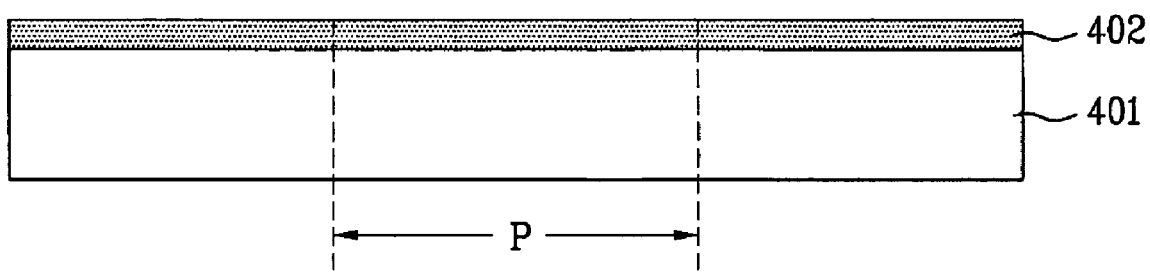
FIGS. 10A to 10F are cross-sectional views illustrating a method for manufacturing the dual-plate organic electroluminescent device according to an embodiment of the invention.

A substrate 401 including a plurality of pixel regions p arranged in a matrix shape is formed. Indium tin oxide (ITO), a transparent conductive metal, is deposited over the entire surface of the upper substrate 401, including the pixel regions p to form a first electrode layer 402, as shown in FIG. 10A.

Figure 10B:
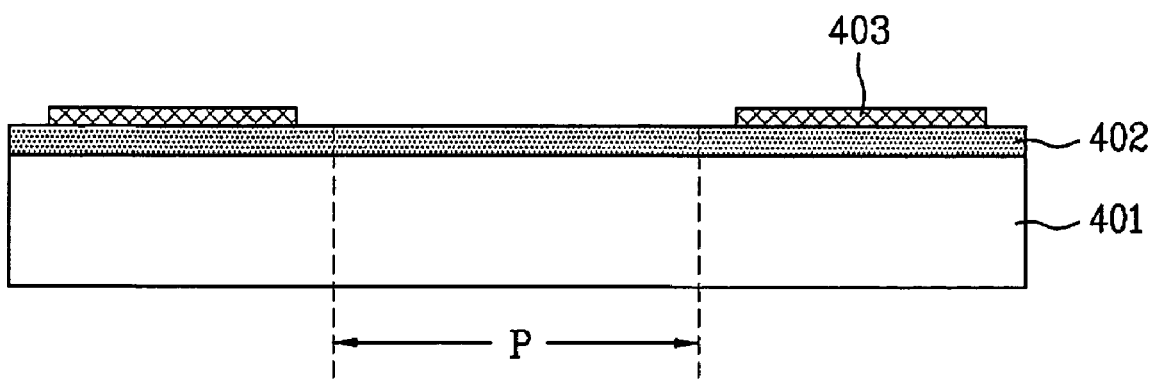

Next, as shown in FIG. 10B, a metal having a high conductivity, such as copper, is deposited over the entire surface of the substrate 401, including the first electrode layer 402. The resulting structure is subjected to patterning by photoresist and etching processes to form a bus line 403 on the first electrode layer 402. The bus line 403 is formed on the first electrode layer 402 except for pixel regions p. The bus line 403 has a lattice shape.

Figure 10C:
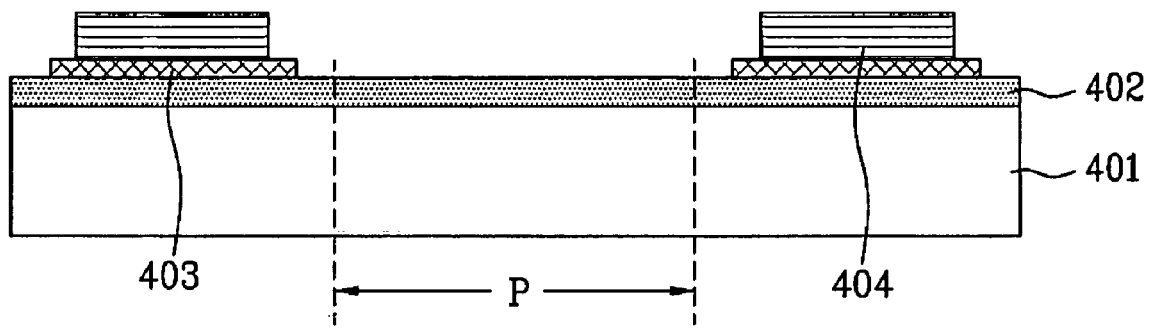

As shown in FIG. 10C, silicon dioxide ($SiO_2$) is deposited over the upper surface of the substrate 401 including the bus line 403. The resulting structure is subjected to patterning by photoresist and etching processes, to form dummy layers 404. At this time, each dummy layer 404 is formed to partially overlap the bus line 403. That is to say, the dummy layer 404 is formed to have a smaller width than that of the associated bus line 403.

Figure 10D:
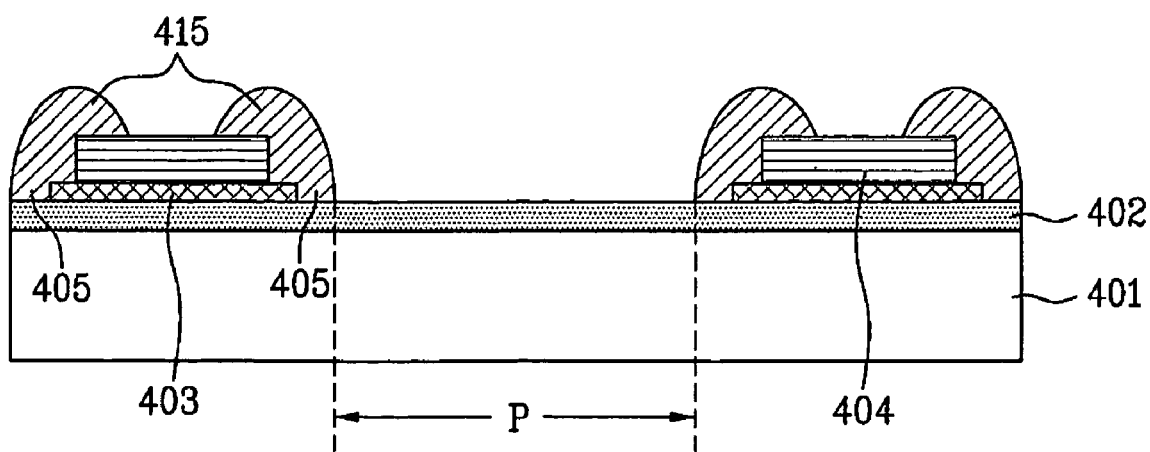

Subsequently, as shown in FIG. 10D, a polyimide is deposited over the entire surface of the upper substrate 401 including the dummy layers 404. The resulting structure is subjected to patterning by photoresist and etching processes to form barrier ribs 405 on the first electrode 402. At the same time, a protrusion 415 is formed to be protruded from one side of each barrier rib 405. The respective barrier ribs 405 are formed on the first electrode layer 402 such that they surround the associated pixel regions p. Protrusions 415 protruding from the sides of the barrier rib 405 are formed to cover an edge of the dummy layers 404 such that only the central portion of each dummy layer 404 is exposed. As described above, the barrier ribs 405 are formed on the bus line 403.

Next, the exposed central portion of each dummy layer 404 is subjected to an etching process using the associated protrusion 415 as a mask. The etching is excessively performed so that the dummy layers 404 are undercut from the protrusions 415. After completion of the etching process, a space 409, where the first electrode layer 402 is exposed, is formed between the adjacent barrier ribs 405 that face each other.

The etching process is carried out by dry etching using a plasma gas. The dummy layers 404 are made of a silicon nitride material. Accordingly, when the dummy layers 404 are subjected to the etching process using the plasma gas, they are undercut from under the protrusions 415. The plasma gas, which serves to etch the dummy layers 404, is also applied to the surfaces of the first electrode layer 402, the bus lines 403 and the barrier ribs 405, so as to hydrophilize the surfaces of the first electrode layer 402, the bus lines 403 and the barrier ribs 405. Thus, etching and surface treatment processes can be simultaneously conducted.

Figure 10E:
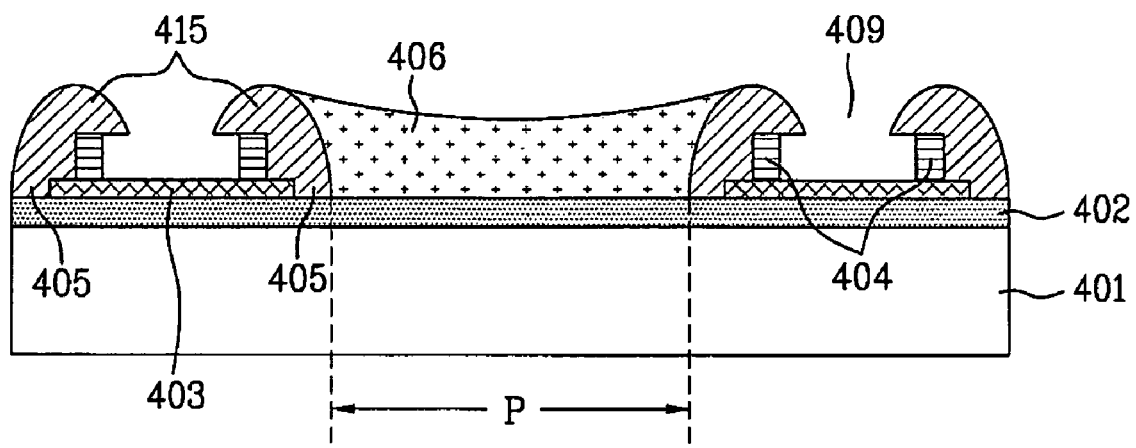

Next, a luminescent solution is applied to the first electrode 402 in each pixel region p using an inkjet applicator (not shown), to form an organic luminescent layer 406, as shown in FIG. 10E. The color of the luminescent solution is red (R), green (G) or blue (B). Each organic luminescent layer 406 includes a first carrier transporting layer and a second carrier transporting layer arranged in the upper and lower portions thereof, respectively (not shown). The first and second carrier transporting layers function to inject and transport the holes and electrons of the first electrode 402 and the second electrode 407 into the organic luminescent layer 406.

Since the surface of the first electrode layer 402 is hydrophilized by plasma, an adhesion between the first electrode layer 402 and the luminescent solution is improved. Further, since the surface of each barrier rib 405 is hydrophobilized by plasma, the adhesion between the surface of barrier rib 405 and the luminescent solution and the adhesion between the surface of bus line 403 and the luminescent solution are reduced. Accordingly, the organic luminescent layer 406 can be selectively formed only on the first electrode layer 402 in each pixel region p.

Figure 10F:
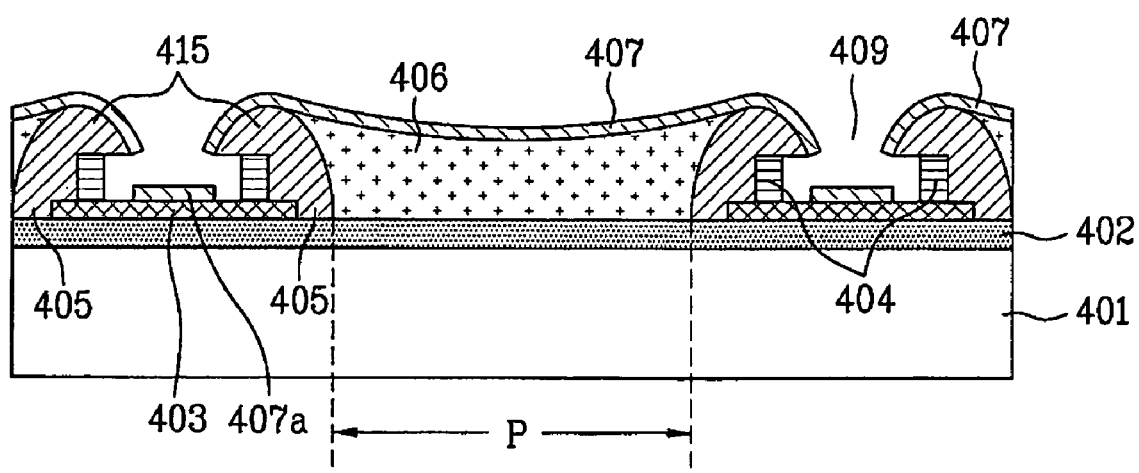

As shown in FIG. 10F, a metal such as titanium (Ti), molybdenum (Mo), calcium (Ca), Kalium (K), magnesium (Mg), barium (Ba) and aluminium (Al) is deposited over the entire upper surface of the upper substrate 401, including the luminescent layer 406, to form second electrode layers 407 as a cathode electrode. The second electrodes 407 in the adjacent pixel regions p are disconnected. That is to say, each second electrode 407 is disconnected by the space 409 formed between the adjacent barrier ribs 405 facing each other due to a step formed between the each dummy layer 404 and each protrusion 415. Accordingly, the respective pixel region p includes separate second electrode layers 407.

Figure 11:
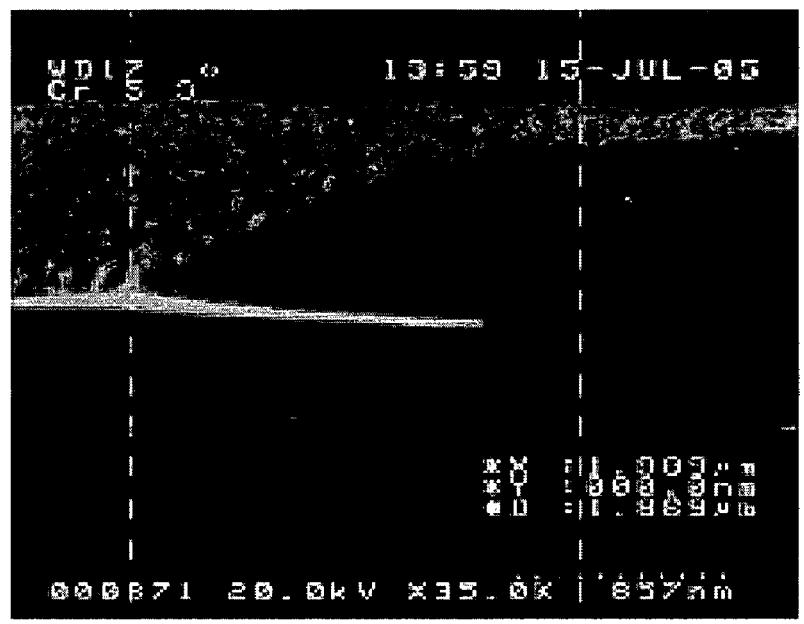
FIG. 11 is an SEM view illustrating an undercut of the barrier rib in regions indicated by the circled reference numerals in FIG. 9.
Figure 12:
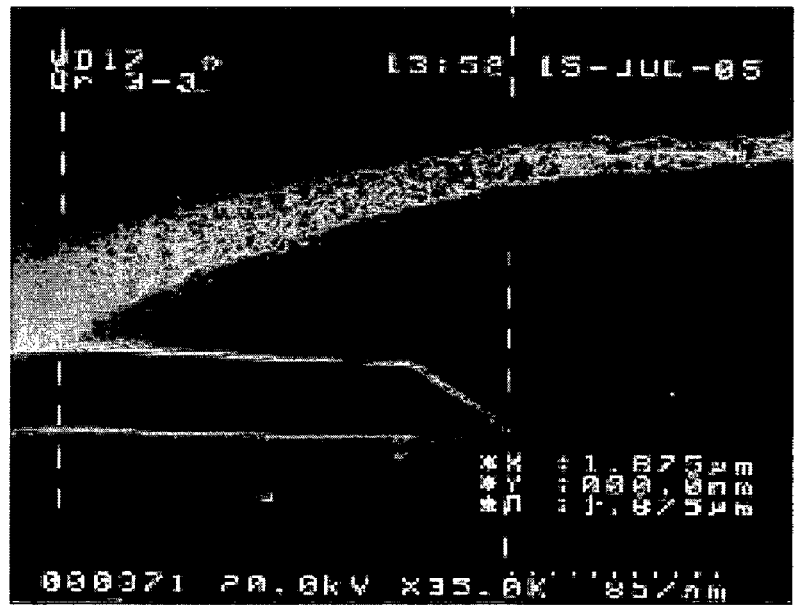
FIG. 12 is an SEM view illustrating an undercut of the barrier rib in regions other than regions indicated by the circled reference numerals in FIG. 9.

FIG. 11 is an SEM view illustrating an undercut of the barrier rib in regions indicated by the circled reference numerals in FIG. 9, and FIG. 12 is an SEM view illustrating an undercut of the barrier rib in regions other than regions indicated by the circled reference numerals in FIG. 9. As shown in FIGS. 11 and 12, in corner portions as well as the remaining portions in each pixel region, the barrier rib is formed on the bus line. More specifically, the barrier rib is located on a level surface without crossing a step. Thus, there is no increase in the protrusions of a barrier rib. Accordingly, protrusions in embodiments of the invention do not collapse toward the bus line, due to a reduction in thickness of the protrusions at the undercut. As a result, it is possible to prevent a short circuit between the first electrode and the second electrode due to a collapsed protrusion.

It will be apparent to those skilled in the art that various modifications and variations can be made in embodiments the invention without departing from the spirit or scope of the inventions. Thus, it is intended that embodiments of the invention cover the modifications and variations of this invention provided they come within the scope of the appended claims and their equivalents.

What is claimed is:

1. A dual plate organic electro-luminescent device comprising:
    a first substrate and a second substrate having pixel regions, wherein the first substrate and the second substrate facing each other;
    a thin film transistor on the first substrate in each of the pixel regions;
    a first electrode on the second substrate;
    a bus line on the first electrode in regions other than the pixel regions such that the bus line has a round shape at each corner portion of each pixel region;
    barrier ribs on outside portions of the bus line so as to surround each of the pixel regions;
    an organic electro-luminescent layer on the first electrode in each of the pixel regions;
    a second electrode formed on the barrier rib and the organic electro-luminescent layer in each of the pixel regions;
    a connection pattern connecting the thin film transistor and the second electrode; and
    a seal pattern on outer portions of the first substrate and the second substrate.

2. The dual plate organic electro-luminescent device according to claim 1, wherein the barrier rib has an undercut structure with a protrusion overhanging the bus line.

3. The dual plate organic electro-luminescent device according to claim 2, further comprising a dummy layer on the bus line, wherein the protrusion overlaps the dummy layer.

4. The dual plate organic electro-luminescent device according to claim 1, wherein the bus line surrounds a pixel region.

5. The dual plate organic electro-luminescent device according to claim 1, wherein the bus line has an elongated rectangular shape with rounded corners.

6. The dual plate organic electro-luminescent device according to claim 1, wherein the bus line has a honeycomb-like shape.

7. The dual plate organic electro-luminescent device according to claim 1, wherein the connection pattern includes:
    a pixel electrode electrically connected to the thin film transistor; and
    a conductive spacer connecting the second electrode and the pixel electrode.

8. The dual plate organic electro-luminescent device according to claim 1, wherein the first electrode is a transparent electrode.

9. The dual plate organic electro-luminescent device according to claim 8, wherein the first electrode is one of indium tin oxide, indium zinc oxide and indium tin zinc oxide.

10. The dual plate organic electro-luminescent device according to claim 1, wherein the bus line is made of a light-shielding metal.

11. The dual plate organic electro-luminescent device according to claim 10, wherein the light-shielding metal is one of titanium, molybdenum, calcium, kalium, magnesium, barium, copper and aluminum.

* * * * *